(12) United States Patent
Sandhu et al.

(10) Patent No.: US 9,514,976 B2
(45) Date of Patent: Dec. 6, 2016

(54) TRENCH ISOLATION IMPLANTATION

(71) Applicant: Micron Technology, Inc., Boise, ID (US)

(72) Inventors: Gurtej S. Sandhu, Boise, ID (US); John A. Smythe, III, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/190,801

(22) Filed: Feb. 26, 2014

(65) Prior Publication Data

US 2014/0241053 A1    Aug. 28, 2014

Related U.S. Application Data

(60) Continuation of application No. 12/758,488, filed on Apr. 12, 2010, now Pat. No. 8,686,535, which is a division of application No. 11/369,236, filed on Mar. 7, 2006, now Pat. No. 7,709,345.

(51) Int. Cl.
| | |
|---|---|
| *H01L 21/762* | (2006.01) |
| *H01L 27/108* | (2006.01) |
| *G11C 11/401* | (2006.01) |
| *H01L 27/115* | (2006.01) |

(52) U.S. Cl.
CPC ........ *H01L 21/76237* (2013.01); *G11C 11/401* (2013.01); *H01L 27/10844* (2013.01); *H01L 27/11517* (2013.01)

(58) Field of Classification Search
CPC .................. H01L 21/76224; H01L 21/762
See application file for complete search history.

(56) References Cited

U.S. PATENT DOCUMENTS

| | | | |
|---|---|---|---|
| 5,118,636 A | 6/1992 | Hosaka | |
| 5,316,965 A * | 5/1994 | Philipossian | ....... H01L 21/3105 148/DIG. 50 |
| 5,721,174 A | 2/1998 | Peidous | |
| 5,902,127 A * | 5/1999 | Park | .............................. 438/435 |
| 6,177,333 B1 | 1/2001 | Rhodes | |
| 6,214,698 B1 * | 4/2001 | Liaw | ................. H01L 21/76224 257/520 |
| 6,261,973 B1 | 7/2001 | Misium et al. | |
| 6,265,282 B1 | 7/2001 | Lane et al. | |
| 6,437,417 B1 | 8/2002 | Gilton | |
| 6,534,807 B2 | 3/2003 | Mandelman et al. | |
| 6,653,201 B2 * | 11/2003 | Chung | .............. H01L 21/76237 257/E21.551 |

(Continued)

*Primary Examiner* — David Vu
(74) *Attorney, Agent, or Firm* — Brooks, Cameron & Huebsch, PLLC

(57) ABSTRACT

Embodiments of the disclosure include a shallow trench isolation structure having a dielectric material with energetic species implanted to a predetermined depth of the dielectric material. Embodiments further include methods of fabricating the trench structures with the implant of energetic species to the predetermined depth. In various embodiments the implant of energetic species is used to densify the dielectric material to provide a uniform wet etch rate across the surface of the dielectric material. Embodiments also include memory devices, integrated circuits, and electronic systems that include shallow trench isolation structures having the dielectric material with the high flux of energetic species implanted to the predetermined depth of the dielectric material.

19 Claims, 3 Drawing Sheets

(56) References Cited

U.S. PATENT DOCUMENTS

| | | |
|---|---|---|
| 6,719,012 B2 | 4/2004 | Doan et al. |
| 6,815,317 B2 | 11/2004 | Schafbauer et al. |
| 6,830,977 B1 | 12/2004 | Jono et al. |
| 6,894,354 B2 | 5/2005 | Jono et al. |
| 6,933,193 B2 | 8/2005 | Wilson |
| 6,960,781 B2 | 11/2005 | Currie et al. |
| 6,982,207 B2 | 1/2006 | Bai et al. |
| 6,989,318 B2 | 1/2006 | Doris et al. |
| 7,271,463 B2 | 9/2007 | Smythe, III et al. |
| 7,354,834 B2 | 4/2008 | Park |

\* cited by examiner

TRENCH ISOLATION IMPLANTATION

PRIORITY INFORMATION

This application is a continuation of U.S. application Ser. No. 12/758,488, filed Apr. 12, 2010, which is a divisional of U.S. application Ser. No. 11/369,236, filed Mar. 7, 2006, now U.S. Pat. No. 7,709,345, issued May 4, 2010, the specifications of which are incorporated herein by reference.

TECHNICAL FIELD

The present disclosure relates generally to semiconductor devices and, more particularly, to trench isolation process technology for use in memory, image, logic and other semiconductor devices.

BACKGROUND

Implementing electronic circuits involves connecting isolated devices or circuit components through specific electronic paths. In silicon integrated circuit (IC) fabrication, it is necessary to isolate devices that are formed in a single substrate from one another. The individual devices or circuit components subsequently are interconnected to create a specific circuit configuration.

As the density of the devices continues to rise, parasitic inter-device currents become more problematic. Isolation technology, therefore, has become an important aspect of integrated circuit fabrication. For example, dynamic random access memory (DRAM) devices generally comprise an array of memory cells for storing data and peripheral circuits for controlling data in the memory cells. Each memory cell in a DRAM stores one bit of data and consists of one transistor and one capacitor. Within the array, each memory cell must be electrically isolated from adjacent memory cells. The degree to which large numbers of memory cells can be integrated into a single IC chip depends, among other things, on the degree of isolation between the memory cells. Similarly, in metal-oxide-semiconductor (MOS) technology, isolation must be provided between adjacent devices, such as NMOS or PMOS transistors or CMOS circuits, to prevent parasitic channel formation.

Shallow trench isolation (STI) is one technique which can be used to isolate devices such as memory cells or transistors from one another. The typical STI process consists of a blanket pad ox, blanket silicon nitride followed by a trench mask and etch through silicon nitride, pad ox and into the crystalline silicon substrate. The mask is stripped and a liner oxide is grown and annealed. Next, high density plasma (HDP) oxide is deposited to fill the trench and again heated to densify the deposited oxide. Finally, the HDP oxide overburden is polished back to the buried silicon nitride and the silicon nitride/pad oxide is stripped prior to gate oxidation. As the HDP fills the trench it forms a vertical seam where the deposited layers of the HDP begin to join to fill the trench.

During the high temperature processing at liner oxide anneal and HDP oxide densification, stresses can develop because of non-uniform heating of the wafer. Within the active region, these stresses can modify the transistor performance. At the wafer level, non-uniformity of stress can cause localized overlay registration errors during the gate masking process. In addition, during the mechanical planarization this seam of the HDP is more vulnerable to over etching as compared to the adjacent HDP layer. As a result, a defect can be created at the seam that can lead to operational problems for the device.

Accordingly, it is desirable to improve the trench isolation techniques to address those and similar problems.

BRIEF DESCRIPTION OF THE DRAWINGS

Features and advantages of the present disclosure will become more apparent from the following detailed description of the embodiments described below in detail with reference to the accompanying drawings where.

DETAILED DESCRIPTION

Figure 1:
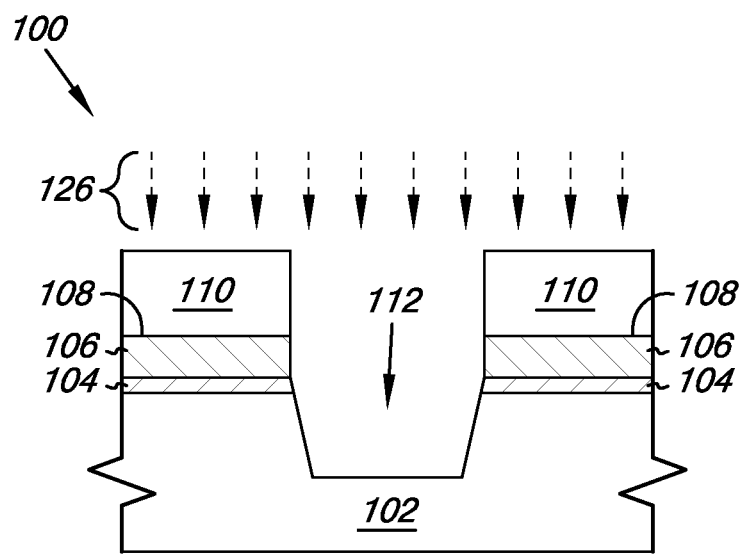
FIG. 1 is a cross-sectional view of an exemplary portion of an embodiment of an in-process shallow trench isolation (STI) structure in accordance with the present disclosure.

In the Figures, the first digit of a reference number refers to the Figure in which it is used, while the remaining two digits of the reference number refer to the same or equivalent parts of embodiment(s) of the present disclosure used throughout the several figures of the drawing. The scaling of the figures does not represent precise dimensions of the various elements illustrated therein.

Embodiments of the present disclosure will now be described in detail with reference to the accompanying figures. It should be note that although the figures illustrate only one shallow trench isolation (STI) region, the semiconductor structures contemplated herein can have any number of STI regions.

The embodiments of the present disclosure provide methods of implanting high flux energetic species into a dielectric material that at least partially fills a trench in a substrate. These implanting methods involve filling the trench at least partially with a dielectric material or materials that will eventually have dielectric properties. A high flux of the energetic species are generated and implanted to a predetermined depth in the dielectric material. The dielectric material with the implanted energetic species is densified through an annealing process. Significantly, the densification is performed at lower temperatures than is typical for other densification processes.

Embodiments of the present disclosure further provide a method of filling a trench of a shallow trench isolation structure with a dielectric material, where a seam extending from a surface of the dielectric material filling the trench is formed. Energetic species are implanted at the surface of the dielectric material layer. The dielectric material layer having the implanted energetic species is densified so the dielectric material layer forming the seam has a wet etch rate equivalent to the remaining densified dielectric material layer. To accomplish this, it is expected that the seam region will have a higher projected range and straggle of the implanted energetic species as compared to the bulk fill material. In addition, the method also includes forming a stop layer adjacent the dielectric material layer of the shallow trench isolation structure, where both the stop layer and the densified dielectric material layer forming the seam can be removed at a similar rate.

"Substrate" or "substrate assembly" as used herein refers to a semiconductor substrate such as a base semiconductor layer or a semiconductor substrate having one or more layers, structures, or regions formed thereon. A base semiconductor layer is typically the lowest layer of silicon material on a wafer or a silicon layer deposited on another material, such as silicon on sapphire. When reference is made to a substrate assembly, various process steps may have been previously used to form or define regions, junctions, various structures or features, and openings such as capacitor plates or barriers for capacitors.

"Layer" as used herein can refer to a layer formed on a substrate using a deposition process. The term "layer" is meant to include layers specific to the semiconductor industry, such as "barrier layer," "dielectric layer," and "conductive layer." (The term "layer" is synonymous with the term "film" frequently used in the semiconductor industry). The team "layer" is also meant to include layers found in technology outside of semiconductor technology, such as coatings on glass.

Referring to FIG. 1, there is shown a cross-sectional view of an exemplary portion of an embodiment of an in-process shallow trench isolation (STI) structure 100. The STI structure 100 includes substrate 102 that can be a silicon structure or other semiconductor wafer that includes a bulk substrate region. For ease of illustration, the figures show active areas and STI field isolation regions in a single well type. However, in general, embodiments of the disclosure are applicable to other semiconductor device isolation regions such as n-well and p-well regions in p-type substrates, n-type substrates and epitaxial substrates, including p on p+, p on p−, n on n+, and n on n− depending on the type of semiconductor device being manufactured. In some implementations, the substrate 102 can comprise gallium arsenide (GaAs) or other semiconductor materials including, but not limited to: Si, Ge, SiGe, GaAs, InAs, InP, CdS, CdTe, other III/V compounds, and the like.

A layer of pad oxide 104, such as a $SiO_2$, can be provided atop the substrate 102, for example, either by deposition or by oxidizing conditions. This includes heating the substrate 102 in an oxygen ambient at high temperature (e.g., 800° C. to about 1100° C.) until the oxide is formed on the surface of the substrate 102. It is also possible to form pad oxide layer 104 by conventional deposition processes such as, but not limited to: chemical vapor deposition (CVD) and plasma vapor deposition (PVD).

A stop layer 106, such as a nitride ($Si_3N_4$) layer or dielectric antireflective coating (DARC) layer which resists erosion during subsequent planarization and etching, is provided over the pad oxide layer 104 and defines an outer surface 108. A mask 110, such as a layer of photoresist, then is deposited and patterned as shown. The mask 110 can be patterned by conventional photolithographic techniques. Other materials and additional layers may also be used to form the mask 110 without departing from the embodiments of the present disclosure.

Mask 110 is patterned to expose regions for forming a trench 112. By trench, it is meant to include any recessed contour, such as a hole, groove, and the like. Moreover, by substrate, it is meant to include any semiconductor layer, and by substrate assembly, it is meant to include any substrate having one or more layers formed thereon or doped regions formed therein.

The stop layer 106 and the pad oxide layer 104 exposed through the mask 110 can then be removed. Suitable techniques for removing the layers can include etching techniques such as, but not limited to: reactive ion etching (RIE), plasma etching and ion beam etching. The etch process is allowed to continue to at least remove a portion of the substrate 102 in forming the trench 112. The depth that etching is performed into the substrate 102 to form the trench 112 is typically of from about 100 to about 800 nm. As will be appreciated, however, other depths may be required depending upon the desired aspect ratio (depth to width) of the opening into the substrate 102. An anisotropic etch such as a plasma or reactive ion etch (RIE) process can be used as the dry etch. The mask 110 can then be removed by wet or dry stripping of the photoresist in the conventional manner.

Figure 2:
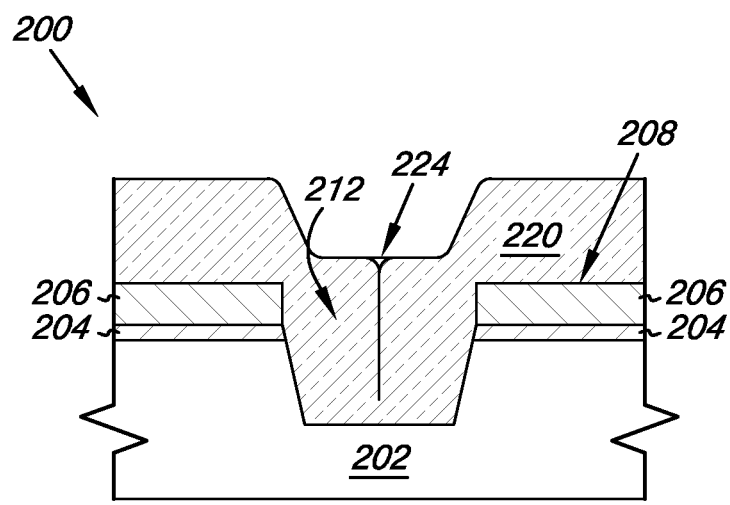
FIG. 2 is a cross-sectional view of an exemplary portion of the embodiment of the STI structure in FIG. 1 after filling with a dielectric material.

Referring to FIG. 2, there is shown a cross-sectional view of an exemplary portion of the embodiment of the STI structure in FIG. 1 after at least partially filling with a dielectric material layer 220. Layer 220 may be formed of a doped or undoped silicon oxide ($SiO_2$). Some undoped silicon oxides include thermal TEOS and high-density plasma (HDP) silicon oxides. Some doped silicon oxides include PSG, BSG, BPSG, B-TEOS, P-TEOS, F-TEOS, silicon germanium oxide, and the like. In this embodiment, an HDP deposition was used to fill trench 212. Alternatively, a thin thermal oxide (not shown) may be grown over the surface of the trench 212 prior to filling with the dielectric material layer 220. Such methods of trench filling are known.

Figure 3:
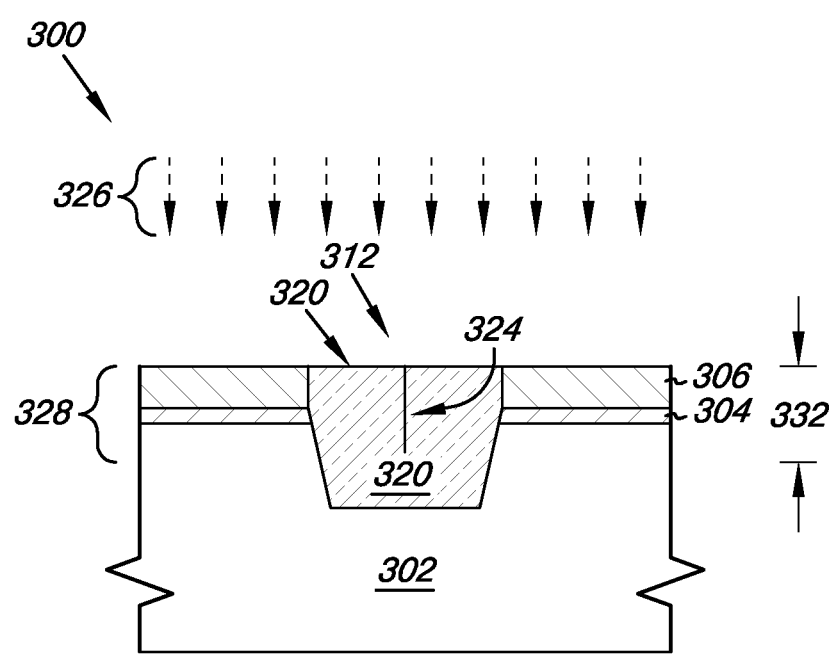
FIG. 3 is a cross-sectional view of an exemplary portion of the embodiment of the STI structure of FIG. 2 after planarization.

Referring to FIG. 3, the STI structure illustrated in FIG. 2 can then undergo mechanical planarization techniques to planarize the dielectric material layer 320 down to the stop layer 306. Depending upon the processes used to form the dielectric material layer 320, a seam 324 can form as the dielectric material layer 320 join from opposing sides of the trench 312. Formation of voids is also possible in the dielectric material layer 320, particularly when it is subjected to thermal cycling. As has been observed during typical processing (e.g., a standard planarization techniques used to planarize the dielectric material layer down to the stop layer followed by a wet removal (e.g., etching) process to remove the stop layer, along with the underlying pad oxide layer), the dielectric material in the area of the seam and/or voids can be more vulnerable to over etching as compared to the adjacent bulk dielectric material layer. As a result, a defect can be created at the seam that can lead to operational problems for the device.

Unlike the typical process, however, embodiments of the STI structure 300 next undergo a high flux energetic species implantation process 326 to implant the energetic species in an upper portion 328 of the dielectric material layer 320. As used herein, an upper portion 328 of the dielectric material layer 320 includes an exposed surface 330 along with a predetermined depth 332 of the dielectric material extending into the layer 320. As used herein, energetic species include heavy ions and low energy heavy ions both formed in a plasma process from elements and/or compounds from either a single source atom type or molecular specie that has mass generally above silicon. Examples of such heavy ions include, but are not limited to, $BF_2$, $GeH_4$, As, P, Se compounds, Ar, $N_2$, $O_2$, and Sb.

In one embodiment, the predetermined depth 332 can be from about 30 nanometers to about 80 nanometers. Alternatively, or in addition, the energetic species implant can be formed at the surface 330 of the dielectric material layer 320 with the energetic species implant having a depth at least as great as the depth of the stop layer 306 and the pad oxide 304. More generally, the depth of the energetic species implant into the dielectric material layer 320 can be in the range of about 3 to about 80 percent the depth of the trench 312. Preferably, the energetic species are implanted to a depth in the range of about 10 to about 40 percent the depth of the trench 312. The energetic species implanted in the upper portion 328 of the dielectric material layer 320 can also have a gradation of energetic species that decreases as the distance from the surface 330 into the trench 312 increases.

Examples of suitable feed gas that produce the heavy ions of the energetic species for implantation can be selected from the group consisting of oxygen ($O_2$), argon (Ar), xenon (Xe), silicon (Si), boron fluorine $BF_2$, germanium (Ge), deuterium ($D_2$) and combinations thereof. The resultant flux of the energetic species at the surface can be expressed as a density of atoms per area (e.g., atoms/$cm^2$) for a given exposure time. Typical values for the density of atoms per area for the energetic species can be in a range from about 14 atoms/$cm^2$ to about 18 atoms/$cm^2$ in order to achieve one to a few monolayers of the energetic species implanted in the dielectric layer.

Examples of suitable devices for generating the high flux of energetic species include, but are not limited to, plasma source ion implantation (PSII), gas cluster ion plasma, and high density plasma tool devices, as are known. In one embodiment, the devices can be operated to implant the energetic species having multiple ion incident angles.

In addition, the energetic species implantation can consist of a stepped or a continuous variation of implant energy sufficient to pass through the surface 330 and into the upper portion 328 of the dielectric layer 320. For example, the implant energy can be from a low value of about 2 eV to about 10 keV. In one embodiment, the choice of implant energy can be made based on upon the desired depth of energetic species implantation into the dielectric layer 320. Alternatively, or in addition, the choice of implant energy can be made based on upon the type of layer(s) adjacent the dielectric material layer 320.

Densification of the energetic species implanted dielectric layer 320 is next employed to reduce the high wet removal (e.g., etch) rate and/or seam propagation of the dielectric material layer 320 during post mechanical planarization wet clean processing. The densification process of the present disclosure can be used in conjunction with standard substantially non-oxidizing anneals and applied after the mechanical planarization clean step. The resulting densification can provide enough wet etch margin against STI fill recess and keyhole propagation during subsequent processing steps. In addition, the densification of the energetic species implanted dielectric layer 320 of the present disclosure can be obtained at lower temperatures and less corrosive oxidizing ambients without overly reacting with the substrate materials.

The structure 300 is then subjected to annealing under conditions effective to densify the energetic species implanted layer of the dielectric material 320. Specifically, the annealing conditions employed in the present disclosure are selected so that the removal rate of the annealed energetic species implanted dielectric layer 320 substantially matches that of the adjacent stop layer 306. This selective annealing step is important in the present disclosure since it ensures that any subsequent removal process (e.g., etching) will remove the energetic species implanted dielectric layer 320 and the stop layer 306 at similar rates thus preventing the formation of any isotropic divots in the dielectric layer 320.

In one embodiment, annealing can be carried out in an inert gas atmosphere, e.g. nitrogen, argon, helium and the like, which may or may not be mixed with oxygen. For example, one example of an as atmosphere employed in the annealing step of the present disclosure is steam at a temperature about 600° C. to about 700° C. for a time interval from about 30 to about 120 seconds. In an additional example, the atmosphere employed for the annealing step is steam at a temperature from about 75° C. to about 600° C. for a time interval from about 30 to about 120 seconds. It should be noted that the annealing step may be carried out in a single ramp step or it can be carried out using a series of ramp and soak cycles.

After annealing and densification of the energetic species implanted dielectric layer 320, the annealed structure 300 is then subjected to a step which is highly selective in removing the stop layer 306. Suitable oxide etch techniques that can be employed in the present disclosure include, but are not limited to: dry etching techniques such as reactive ion etching (RIE), plasma etching, ion beam etching and chemical dry etching. The gases which may be employed in these etching techniques are those that have a high affinity and selectivity for the stop layer 306 as well as the energetic species implanted dielectric layer 320.

Examples of suitable gases that can be employed in the dry etching process include: $CF_4$, $SF_6$, $NF_3$, $CHF_3$ and combinations thereof. The gases may also be used in conjunction with oxygen or an inert gas such as nitrogen or helium. Alternatively, the oxide etch is carried out using a wet chemical etch process. Suitable chemical etchants which can be employed to selectively remove the densified dielectric layer 320 and the stop layer 306 include HF and $HNO_3$. Buffered solution can also be employed in the present disclosure.

Additional processes can be performed using known techniques to complete an integrated circuit (IC) for use in an electronic system that includes a controller (e.g., a processor) and active semiconductor regions separated by the STI structure. Various types of devices can be formed in the active areas. Such devices include imaging devices, memory devices or logic devices. For example, the completed IC can include an array of memory cells for a DRAM or other memory device. In other ICs, logic devices for gate arrays, microprocessors or digital signal processors can be formed in the active regions. The STI structure 300 can separate the active regions from one another.

Embodiments of the present disclosure further include an integrated circuit, methods of forming the integrated circuit, memory devices, and electronic systems that include the memory devices, having a plurality of active regions in a first region of a semiconductor substrate that are separated by shallow trench isolation structures of the present disclosure. As discussed herein, trenches separating at least two of the active regions from one another are formed by removing the substrate. Each trench can then be at least partially filled with the dielectric material or materials that will eventually have dielectric properties.

Figure 4:
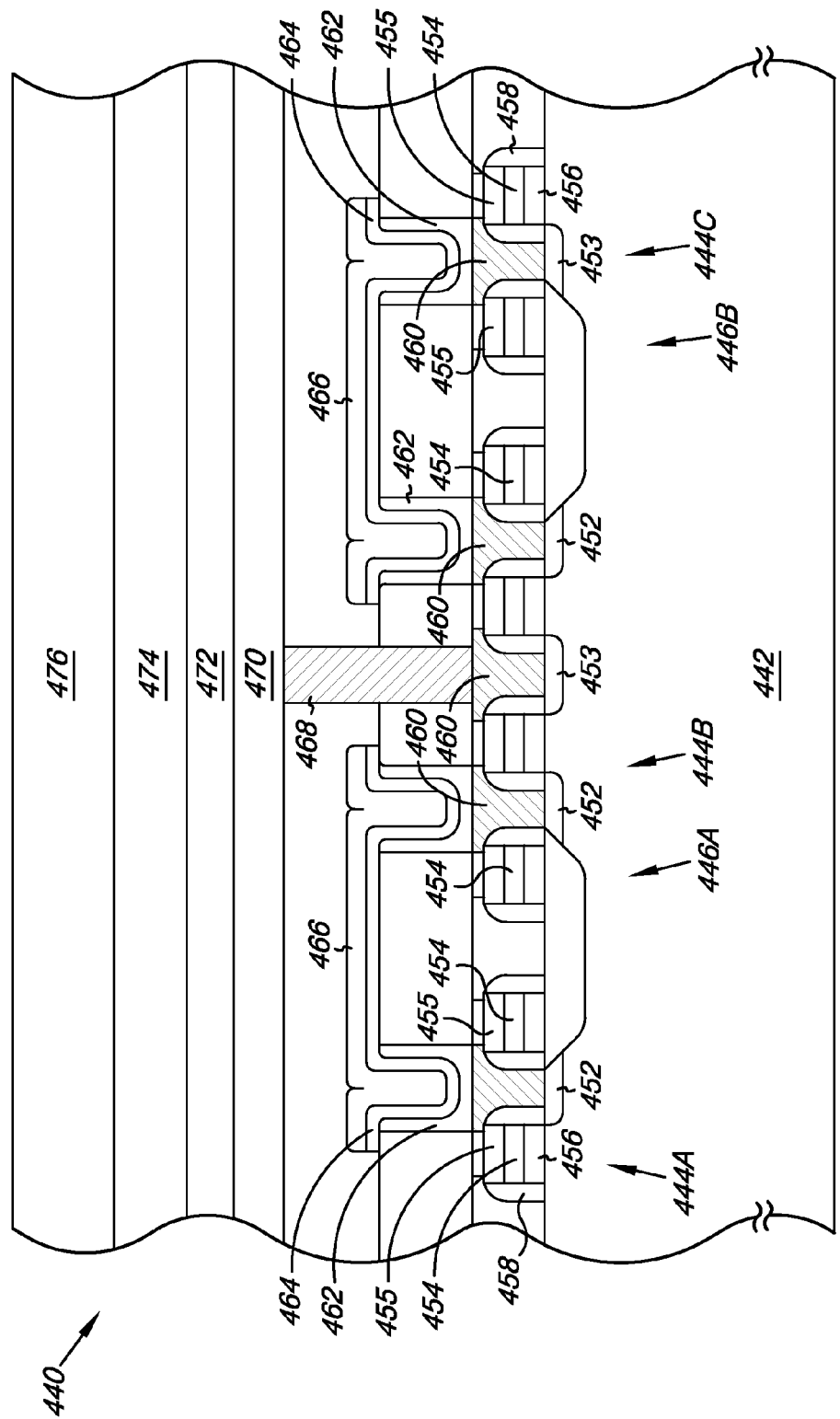
FIG. 4 is a cross-sectional view of an exemplary integrated circuit that includes STI structures of the present disclosure separating active regions.

As discussed herein, energetic species are then directing at an upper surface of the substrate after at least partially filling the trenches with the dielectric material. In one embodiment, ions of the energetic species are implanted at a depth of about 30 to 80 nanometers below the surface of the dielectric material. The dielectric material filling the trench can also include a seam, as discussed herein. Upon densification the energetic species implanted into a surface of the dielectric material provide for uniform wet etch rates across the surface of the dielectric material, including the seam. FIG. 4 illustrates portions of exemplary integrated circuits which include STI structures separating active regions. The STI structures can be formed using the techniques described above. In FIG. 4, a stacked-cell DRAM 440 includes a semiconductor substrate 442 with multiple active regions 444A, 444B, 444C separated by shallow trench isolation regions 446A, 446B. Each isolation region 446A, 446B includes the dielectric layer 420 formed according to embodiments of the present disclosure.

Impurity-doped regions 452, 453 can be formed, for example, by a diffusion implanted process with the regions 452 serving as storage nodes for memory cells of the DRAM. Stacked gates are provided over the gate oxide layers 456 with nitride or other spacers 458 provided on either side of the gates. The stacked gates include a polysilicon layer 454 and an insulating layer 455. The insulating layer 455 can include, for example, a deposited oxide, a deposited nitride, or a composite stack of oxide/nitride or oxide/nitride/oxide layers. In some implementations, each gate stack also includes a silicide layer between the polysilicon layer 454 and the insulating layer 455. The silicide layer can include, for example, a tungsten silicide, a titanium silicide or a cobalt silicide. In yet other implementations, the gate stack includes a barrier metal layer and a metal layer between the polysilicon layer 454 and the insulating layer 455. Suitable barrier metal layers include tungsten nitride, titanium nitride and tantalum nitride. The metal layer can include tungsten, tungsten silicide, titanium silicide, or cobalt silicide. Polysilicon plugs 460 form the contacts to the drain and source regions 452.

In the illustrated integrated circuit of FIG. 4, capacitor cells comprise lower storage node electrodes 462, a cell dielectric 464 and an upper electrode 466. A metal contact 468 provides the electrical connection between one of the plugs 460 which serves as the bit line and a first metallization layer 470. An insulating layer 472 separates the first metallization layer 470 from a second metallization layer 474. The entire semiconductor wafer is covered by a passivation layer 476.

Although FIG. 4 illustrates a stacked-cell DRAM, isolation regions formed according to the techniques described above can be incorporated into any other type of memory such as trench cell DRAMs, flash memory, embedded memory, electrically erasable programmable read only memory (EEPROM), and the like.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A semiconductor structure comprising:
a semiconductor substrate having a shallow trench isolation (STI) structure formed therein, wherein the STI structure includes a trench containing a dielectric material adjacent to the semiconductor substrate and having an energetic species implanted therein across an entire width of the trench;
a pad oxide formed over the semiconductor substrate; and
a stop material formed over the pad oxide,
wherein the dielectric material includes the energetic species implanted to a depth in the trench at least as great as a depth of the stop material and the pad oxide outside the trench, and wherein the energetic species implanted in the dielectric material has a gradation from an upper surface of the dielectric material that decreases as a depth of the trench increases.

2. The semiconductor structure of claim 1, wherein the dielectric material includes the energetic species implanted to at least three percent (3%) of a depth of the trench from the upper surface.

3. The semiconductor structure of claim 1, wherein the dielectric material includes the energetic species implanted to about eighty percent (80%) of a depth of the trench from the upper surface.

4. The semiconductor structure of claim 1, wherein the dielectric material includes the energetic species implanted to a depth of greater than about ten percent (10%) and less than about forty (40%) of a depth of the trench from the upper surface.

5. The semiconductor structure of claim 1, wherein the dielectric material includes the energetic species implanted so as to have a gradation of energetic species that decreases as the distance from the upper surface into the trench increases.

6. The semiconductor structure of claim 1, wherein the dielectric material is undoped silicon oxide ($SiO_2$) and the implanted energetic species includes heavy ions of elements and/or compounds that has a mass greater than that of silicon.

7. The semiconductor structure of claim 6, wherein the heavy ions include boron fluorine ($BF_2$).

8. The semiconductor structure of claim 6, wherein the heavy ions include germane ($GeH_4$).

9. The semiconductor structure of claim 6, wherein the heavy ions include (arsenic) As.

10. The semiconductor structure of claim 6, wherein the heavy ions include phosphorous (P).

11. The semiconductor structure of claim 6, wherein the heavy ions include selenium (Se) compounds.

12. The semiconductor structure of claim 6, wherein the heavy ions include antimony (Sb).

13. A semiconductor structure comprising:

a semiconductor substrate having a shallow trench isolation (STI) structure formed therein, the STI including a trench containing a dielectric material adjacent to the semiconductor substrate, a pad oxide formed over the semiconductor substrate; and a stop material formed over the pad oxide, wherein the dielectric material adjacent to the semiconductor substrate includes:

a first portion having an energetic species implanted therein across an entire width of the trench to a depth in the trench at least as great as a depth of the stop material and the pad oxide outside the trench, wherein the energetic species implanted in the dielectric material has a gradation from an upper surface of the dielectric material that decreases as a depth of the trench increases; and a second portion located between the first portion and the semiconductor substrate, the second portion not having an energetic species implanted therein.

14. The semiconductor structure of claim 13, wherein the first portion includes the energetic species implanted to a depth of greater than about 30 nanometers and less than about 80 nanometers from an interface with the second portion.

15. The semiconductor structure of claim 13, wherein the first portion includes the energetic species implanted so as to have a gradation of energetic species that decreases as the distance into the trench increases from an interface with the second portion.

16. A semiconductor structure comprising:

a semiconductor substrate;

a pad oxide;

a stop material formed over the pad oxide; and a shallow trench isolation (STI) structure formed through the pad oxide and stop material and into the semiconductor substrate, the STI including a trench containing a dielectric material, the dielectric material adjacent to the semiconductor substrate and having:

a first portion adjacent the stop material having an energetic species implanted therein across an entire width of the trench to a depth in the trench below a lower surface of the pad oxide, wherein the energetic species implanted in the dielectric material has a gradation from an upper surface of the dielectric material that decreases as a depth of the trench increases; and a second portion located between the first portion and the semiconductor substrate, the second portion not having an energetic species implanted therein, wherein the stop material and the portion of the dielectric adjacent the surface have a similar etch rate.

17. The semiconductor structure of claim 16, wherein the STI includes a seam extending from the surface, and wherein the portion of the dielectric adjacent the surface has a uniform wet etch rate across the surface of the dielectric material including the seam.

18. The semiconductor structure of claim 16, wherein the dielectric material includes one monolayer of the energetic heavy ions implanted therein.

19. The semiconductor structure of claim 16, wherein the dielectric material includes a plurality of monolayers of the energetic heavy ions implanted therein.

\* \* \* \* \*